(12) United States Patent  (10) Patent No.: US 7,746,607 B2
Gauthier, Jr. et al.  (45) Date of Patent: Jun. 29, 2010

(54) SUBSTRATE TRIGGERING FOR ESD PROTECTION IN SOI

(75) Inventors: Robert J. Gauthier, Jr., Hinesburg, VT (US); Junjun Li, Willston, VT (US); Souvick Mitra, Burlington, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 11/380,525

(22) Filed: Apr. 27, 2006

(65) Prior Publication Data

US 2007/0253126 A1    Nov. 1, 2007

(51) Int. Cl.
 *H02H 3/22* (2006.01)
(52) U.S. Cl. .......................................... 361/56; 361/111
(58) Field of Classification Search .................... 361/56, 361/111; 257/355–360
See application file for complete search history.

(56) References Cited

U.S. PATENT DOCUMENTS

| 6,034,388 | A | 3/2000 | Brown et al. |
| 6,096,584 | A | 8/2000 | Ellis-Monaghan et al. |
| 6,331,726 | B1* | 12/2001 | Voldman ..................... 257/541 |
| 6,380,570 | B1* | 4/2002 | Voldman ..................... 257/288 |
| 6,384,452 | B1 | 5/2002 | Chittipeddi et al. |
| 6,404,269 | B1 | 6/2002 | Voldman |
| 6,507,469 | B2* | 1/2003 | Andoh ......................... 361/56 |
| 6,909,149 | B2 | 6/2005 | Russ et al. |
| 7,064,358 | B2* | 6/2006 | Manna et al. ............... 257/173 |
| 7,068,482 | B2* | 6/2006 | Chen ............................. 361/56 |
| 2005/0121702 | A1 | 6/2005 | Voldman et al. |
| 2005/0167786 | A1 | 8/2005 | Gill et al. |
| 2006/0043489 | A1* | 3/2006 | Chen et al. .................. 257/355 |

* cited by examiner

*Primary Examiner*—Danny Nguyen
(74) *Attorney, Agent, or Firm*—Richard Kotulak; Roberts Mlotkowski Safran & Cole, P.C.

(57) ABSTRACT

Electrostatic discharge (ESD) protection device and process for protecting a conventional FET. The device includes at least one FET body forming a resistance, and a triggering circuit coupled to a protection FET and the resistance. The resistance raises a voltage of the at least one body, such that the protection FET is triggered at a voltage lower than the conventional FET.

11 Claims, 7 Drawing Sheets

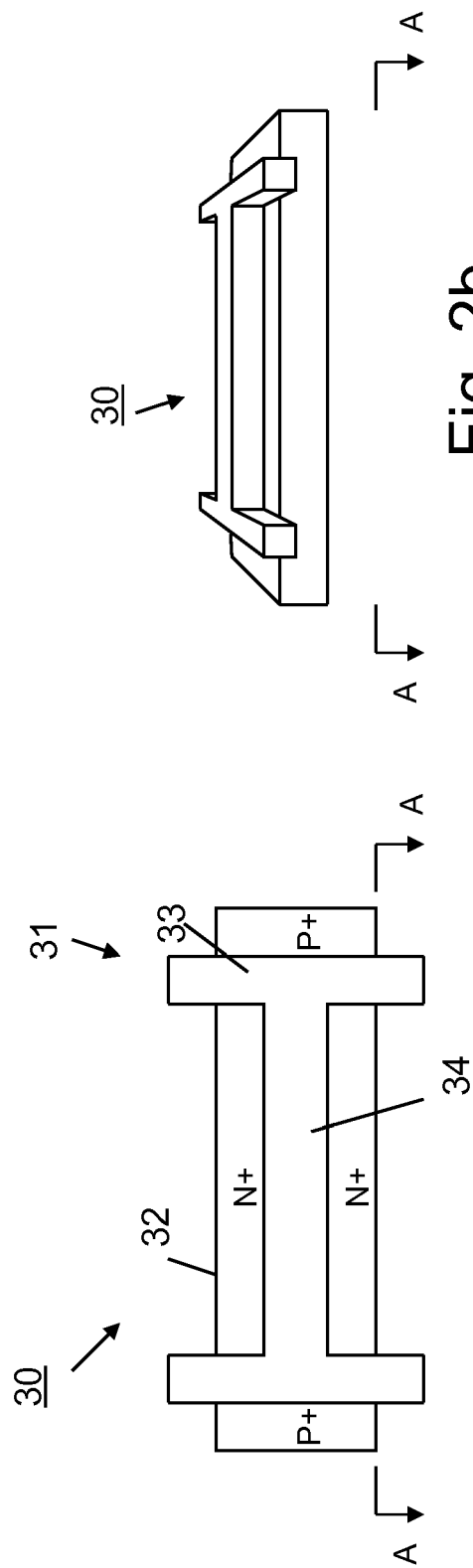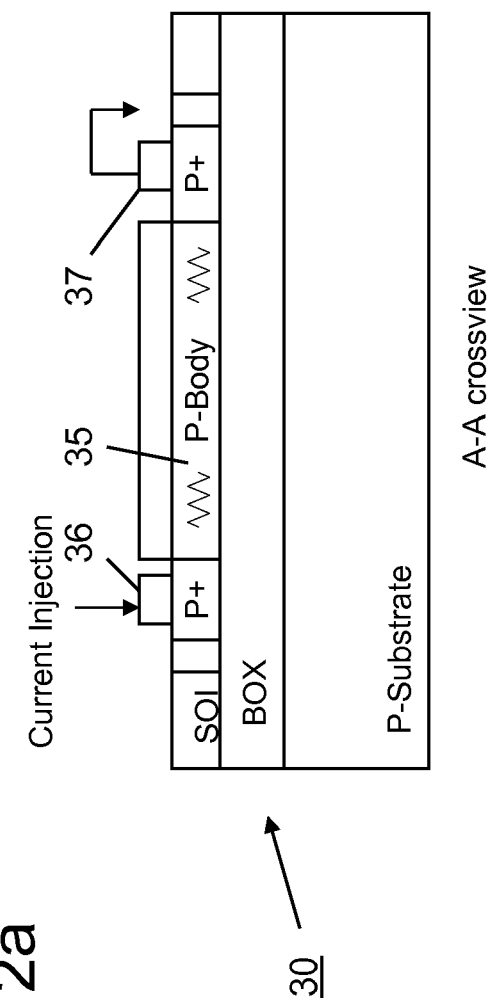
Fig. 2a
Fig. 2b
Fig. 2c
A-A crossview

SUBSTRATE TRIGGERING FOR ESD PROTECTION IN SOI

FIELD OF THE INVENTION

The instant invention relates to a protection method and device for CMOS technology and to NFET based protection in silicon-on-insulator (SOI) technology.

BACKGROUND DESCRIPTION

Diode and power supply clamps are used as the main workhorse for electrostatic discharge (ESD) protection. However, with drastic scaling of technology and decreasing oxide thickness, make the known methods insufficient; as it produces a relatively high clamping voltage at the I/O pad.

As electronic components become smaller and smaller along with the internal structures in integrated circuits, it is becoming easier to either completely destroy or otherwise impair electronic components. In particular, many integrated circuits are highly susceptible to damage from the discharge of static electricity, even at levels which can neither be seen nor felt. This is typically referred to as electrostatic discharge (ESD), in which the transfer of an electrostatic charge occurs between bodies at different electrostatic potentials (voltages) caused by direct contact or induced by an electrostatic field.

The discharge of static electricity, or ESD, has become a critical problem for the electronics industry. Device failures are not always immediately catastrophic, but often the device is weakened thus less able to withstand normal operating stresses and, hence, may result in a reliability problem. Therefore, various ESD protection circuits must be included in the device to protect the various components, with various considerations necessary for ESD protection circuits.

Much effort has been expended by industry to protect electronic devices from ESD damage. Traditionally, ESD designs are custom designed using graphical systems. ESD ground rules and structures are typically built into the designs requiring a custom layout. This has lead to custom design for digital products such as, for example, DRAMs, SRAMs, microprocessors, ASIC development and foundry technologies.

In order to meet performance targets, advanced CMOS technologies are pushing the limits of device capabilities. However, with aggressive scaling, device reliability is becoming a measure of device performance. As the limits of device capabilities are reached, factors such as device reliability due to ESD sensitivity become more critical, while at the same time difficult to address.

SUMMARY OF THE INVENTION

The present invention is directed to an electrostatic discharge (ESD) protection device for protecting a conventional FET. The ESD protection device includes at least one FET body forming a resistance and a triggering circuit coupled to a protection FET and the resistance. The resistance raises the voltage the body, such that the protection FET is triggered at a voltage lower than the conventional FET.

Further, the present invention is directed to a process for protecting a conventional FET from electrostatic discharge (ESD). The process includes raising voltage of the body of a protection FET such that a trigger voltage of the protection FET is lower than that of the conventional FET.

The present invention is directed to an electrostatic discharge (ESD) protection structure. The structure includes an intrinsic body resistance forming a current pumping path, and an injection current input.

BRIEF DESCRIPTION OF THE DRAWINGS

FIGS. 2a-2c illustrate an NFET structure for the ESD protection circuit in accordance with the invention;

DETAILED DESCRIPTION OF THE EMBODIMENTS OF THE INVENTION

Enhancements based on intrinsic SOI device structure are utilized to protect structures to meet ESD criteria for SOI technology. Substrate pumping, i.e., current injection into body (substrate) achieves lower turn on voltage without using RC triggering at the body. Further, the structure to achieve substrate triggering in SOI can include a diode string or reverse biased zener diode integrated into the body of an FET device.

In MOSFET based ESD protection, trigger voltage of the protection MOSFETs play an important role and hence one needs to tune this parameter to optimize the ESD performance. A conventional solution has been to adjust the trigger voltage of a protection FET by applying a bias voltage to the body or substrate of the protection FET. When the body (or substrate) is unbiased, the trigger voltage occurs at a higher level than when the body (or substrate) is biased with a voltage of, e.g., 0.75 V. Thus, it is understood that biasing the NFET lowers the trigger voltage, which allows such an ESD protection NFET to protect a conventional NFET.

According to the invention, a lower triggering voltage for the protection FET is achieved. This enables NFET based protection, such that the need for a power clamp on the supply rail and the impact of supply busing resistance is decreased. Thus, input/output (I/O) protection can be achieved with a more flexible I/O design. Moreover, according to the invention, a single ESD NFET protects a single NFET/output driver.

Figure 1:
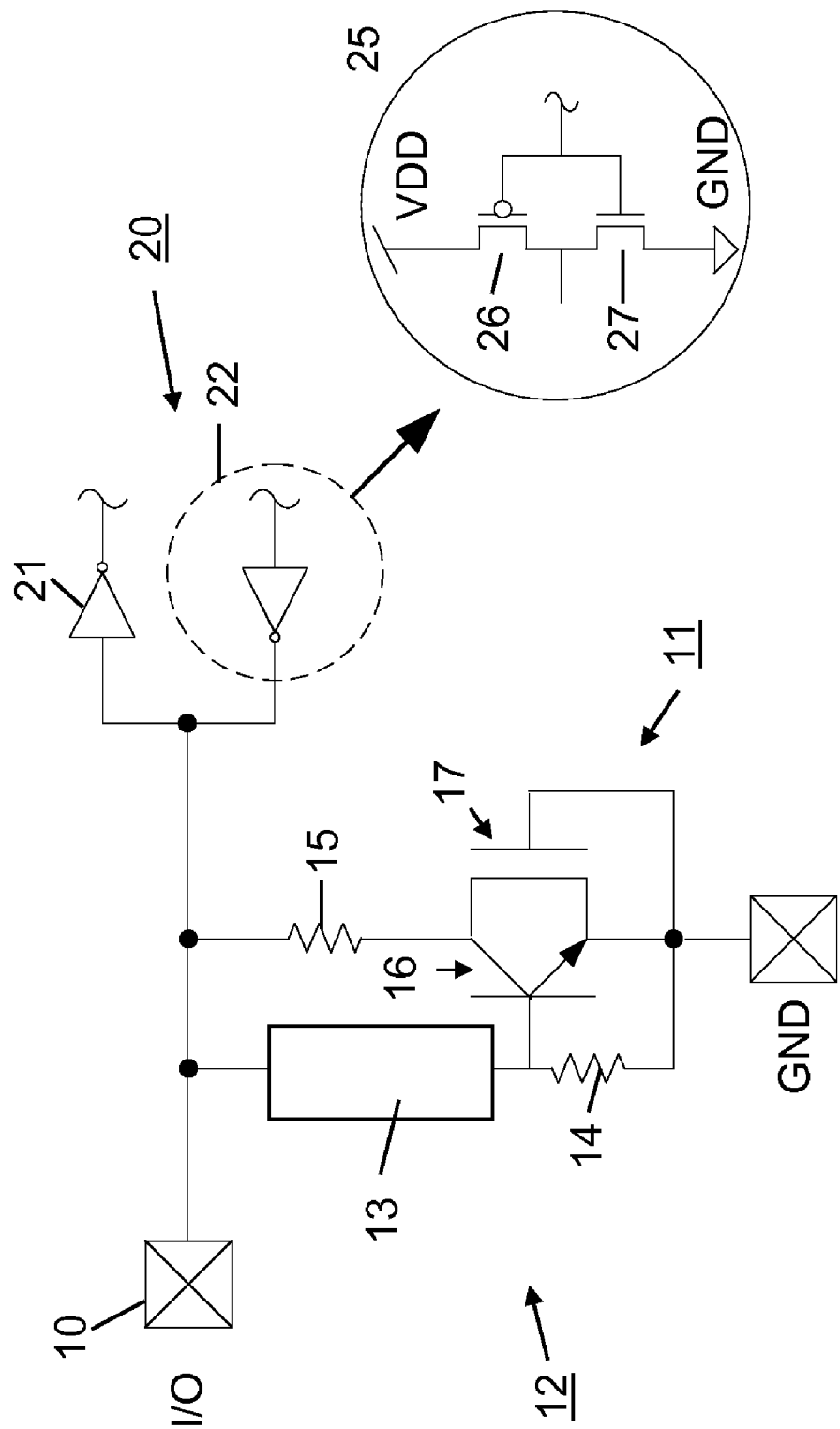
FIG. 1 schematically illustrates an ESD protection circuit in accordance with the invention.

A schematic of an ESD protection circuit is illustrated in FIG. 1. As shown, an input/output (I/O) 10 sends and receives data from a protected circuit 20 represented by inverters 21 and 22. Moreover, inverter 22 is shown in greater detail by inset 25 by a static inverter composed of an upper FET 26 coupled to voltage (VDD) and a lower (protected) FET 27 coupled to ground (GND). Circuit 20 is protected from ESD by protection circuit 12, which includes an injection source 13 and an NFET structure 11 composed of an intrinsic resistance, i.e., a resistor 14 having a large resistance in the MΩ range, a resistor 15 having a very small resistance in a range of 5-10Ω or less, an intrinsic bipolar transistor 16 and an nMOSFET 17. Injection source 13, discussed in greater detail below, is coupled to I/O 10 and to resistor 14 and the base of transistor 16. The end of resistor 14 opposite injection source 13 is coupled to ground (GND). Resistor 15 is coupled between I/O 10 and the collector of transistor 16. The emitter of transistor 16 is coupled to ground (GND). Further, the source and drain of transistor 17 are coupled to the emitter and collector of bipolar transistor 16. However, it is noted that bipolar transistor 16 is not a discrete device, but an intrinsic, parasitic device of NFET structure 11.

Injection source 13 injects current into the body/substrate of the NFET structure 11, also referred to as "substrate pumping," in order to lower trigger voltage to enable NFET based ESD protection of circuit 20. Thus, to provide sufficient protection, the current injection is utilized to lower the trigger voltage of ESD NFET to a value lower than that of protected NFET 27.

Various views of NFET structure 11 are illustrated in FIGS. 2a-2c as NFET structure 30. In particular, FIG. 2a shows a top view of NFET structure 30, FIG. 2b illustrates a side perspective view of NFET structure 30, and FIG. 2c illustrates a sectional side view along line A-A depicted in FIGS. 2a and 2b. NFET structure 30 shown in FIGS. 2a-2c is generally known as an "H-body" structure, however, it is contemplated that the NFET structure can also be formed by a plurality of "T-body" structures coupled to a remote "H-body" structure. Moreover, by way of example, the H-body structure is formed in 65 nm SOI technology.

Figure 3:
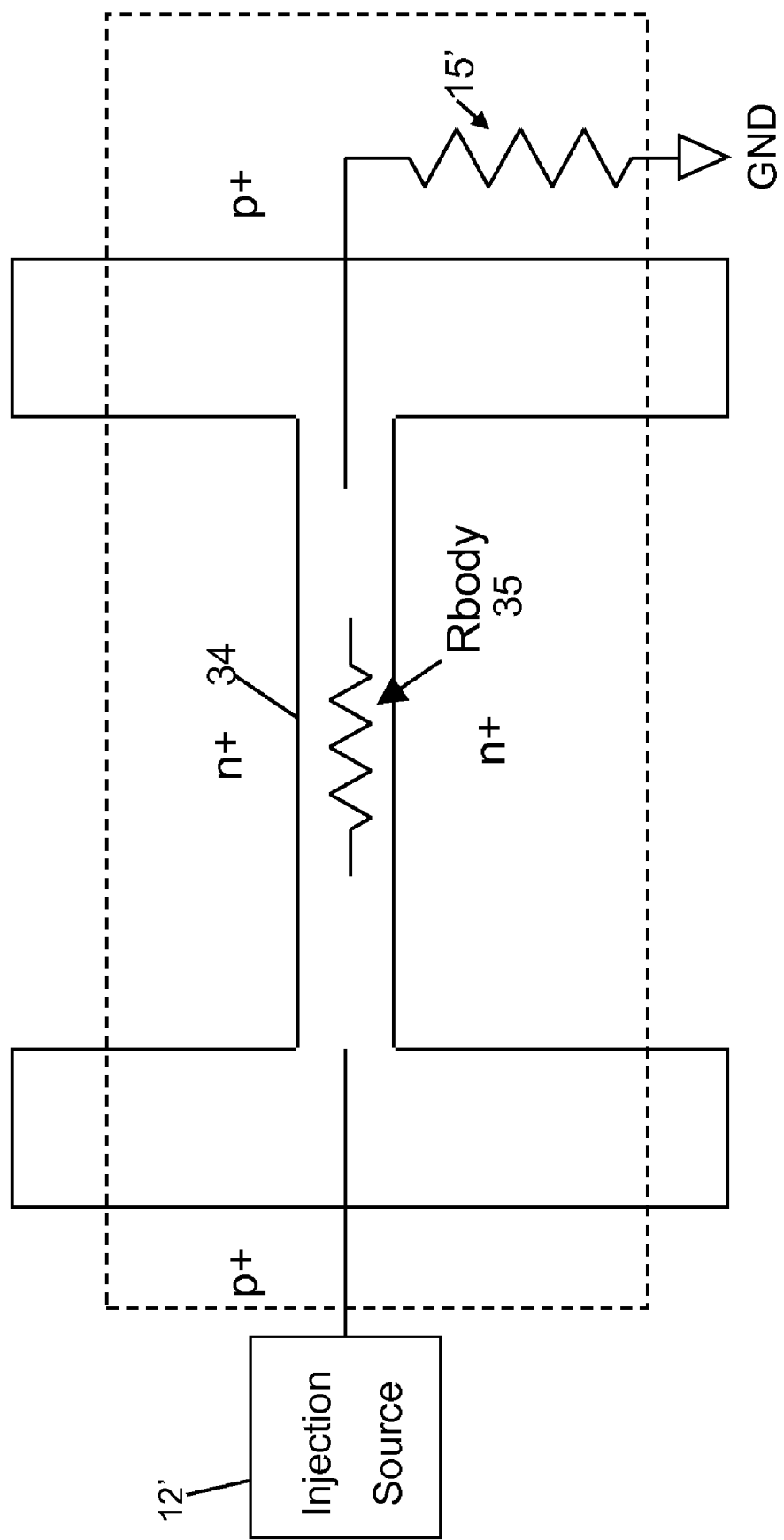
FIG. 3 schematically illustrates an H-body structure coupled to an injection source and to ground through a small resistance.

As shown in FIGS. 2a and 2b, an H-body 31 of a polysilicon material is deposited onto substrate 32, which is divided to form P+ and N+ regions. Further, H-body 31 is composed of uprights 33, which can have a length in the range of hundreds of nanometers, and crosspiece 34, which can have a length in the range of 65 nm. Moreover, in order to achieve a high resistance in crosspiece 34, i.e., to form the intrinsic resistance in the megaohm range, doping material is loaded into the p body. Thus, this high resistance corresponds to resistor 14 depicted in FIG. 1, and is schematically illustrated in FIG. 2c, as P-body 35, formed on a buried oxide (BOX) layer over a p-substrate. This approach is attractive in SOI technologies due to the high intrinsic body resistance 35 of the crosspiece 34, and a schematic illustration of the H-body is shown in FIG. 3 coupled to an injection source 12' and to ground through a small resistor 15'.

A body/substrate contact 36 shown in FIG. 2c is formed on NFET structure 30 to be coupled to the injection source (shown in FIG. 1) to receive current injection, and a body/substrate contact 37 is also formed on NFET structure 30 to be coupled to ground, either directly or through a small resistance.

Figure 4:
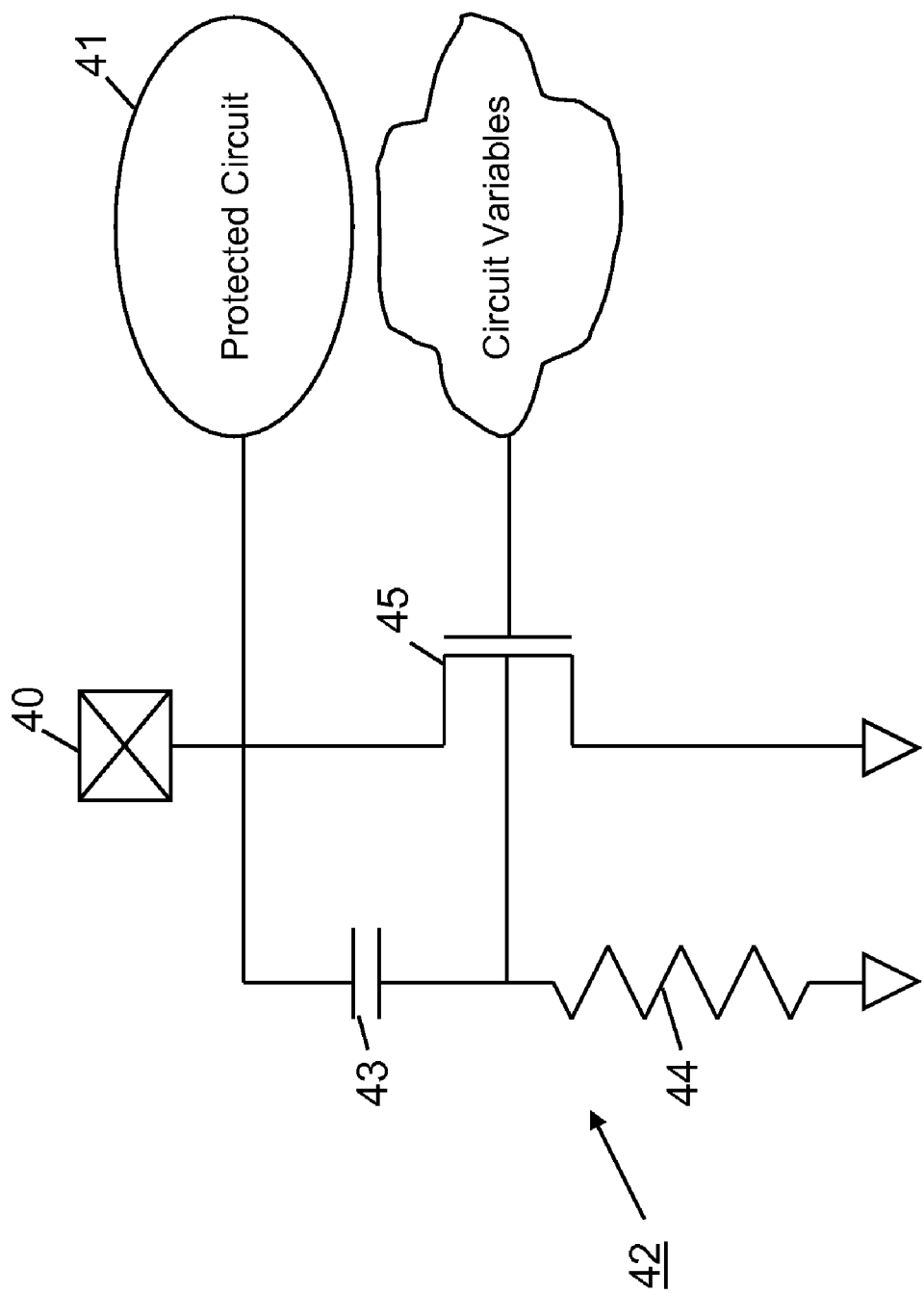
FIG. 4 illustrates a known RC triggered based ESD protection.

FIG. 4 illustrates a conventional RC triggered based ESD protection used in bulk CMOS technology. Input/output (I/O) 40 is coupled to a protected circuit 41, which is protected by an FET 45 coupled to an RC circuit 42 composed of capacitor 43 and resistor 44. The capacitor acts as a current injection source to trigger FET 45. However, this arrangement only works well with low frequency I/Os, i.e., below several hundred kHz, e.g., 500 kHz or below.

Figure 5:
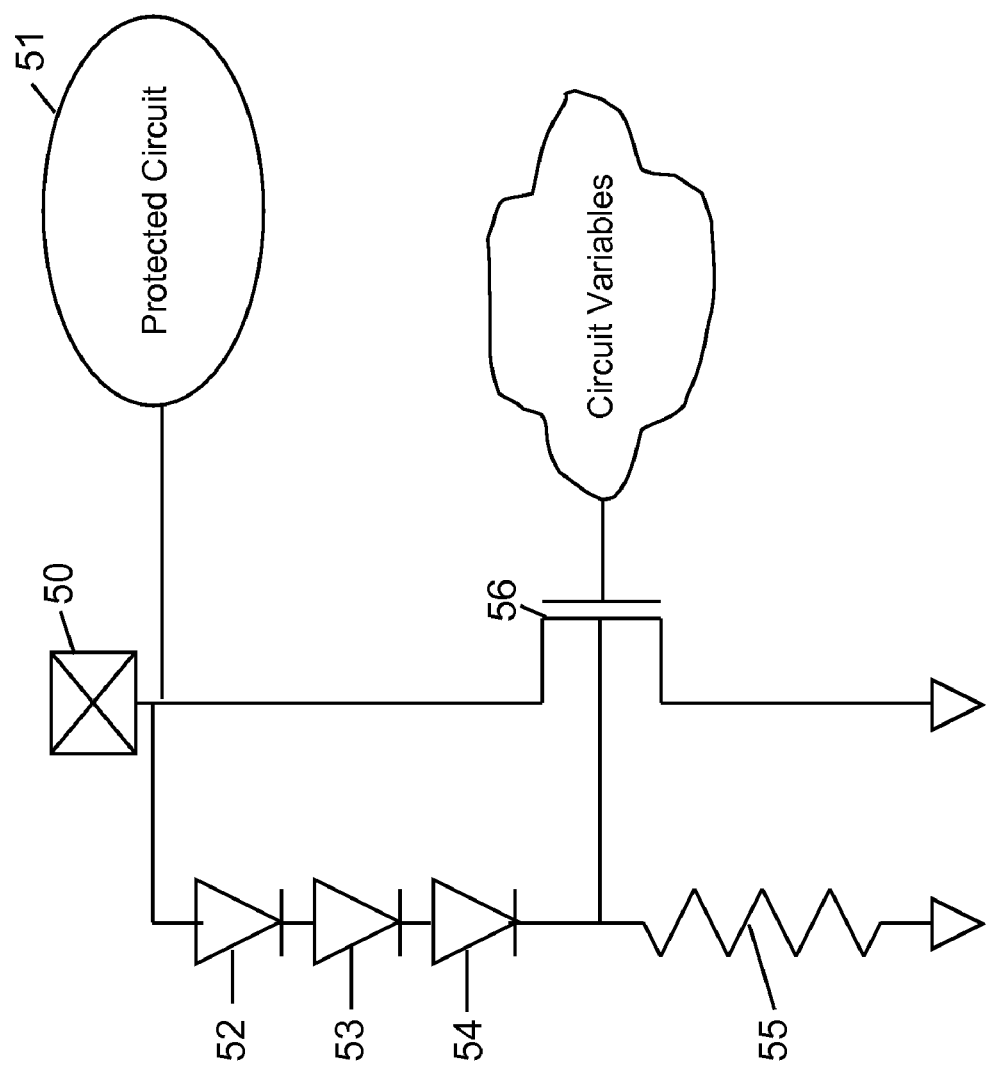
FIG. 5 illustrates the ESD protection circuit with a diode string current injector.

In an exemplary embodiment of the invention, as illustrated in FIG. 5, the injection source discussed above in FIG. 1 can be formed by, e.g., a diode string. The number of diodes in the string depends on the normal supply voltage to the circuit at I/O 50. By way of example, if I/O 50 has a supply voltage of 2V to protected circuit 51, a string of three diodes 52, 53, and 54 would provide for a 2.1-3V drop, coupled to ground through resistor 55 in the megaohm range, to provide the current injection into the body. In this manner, the triggering voltage for the protection NFET 56 is lowered to a level to below the triggering voltage of the protected NFET in protected circuit 51.

Figure 6:
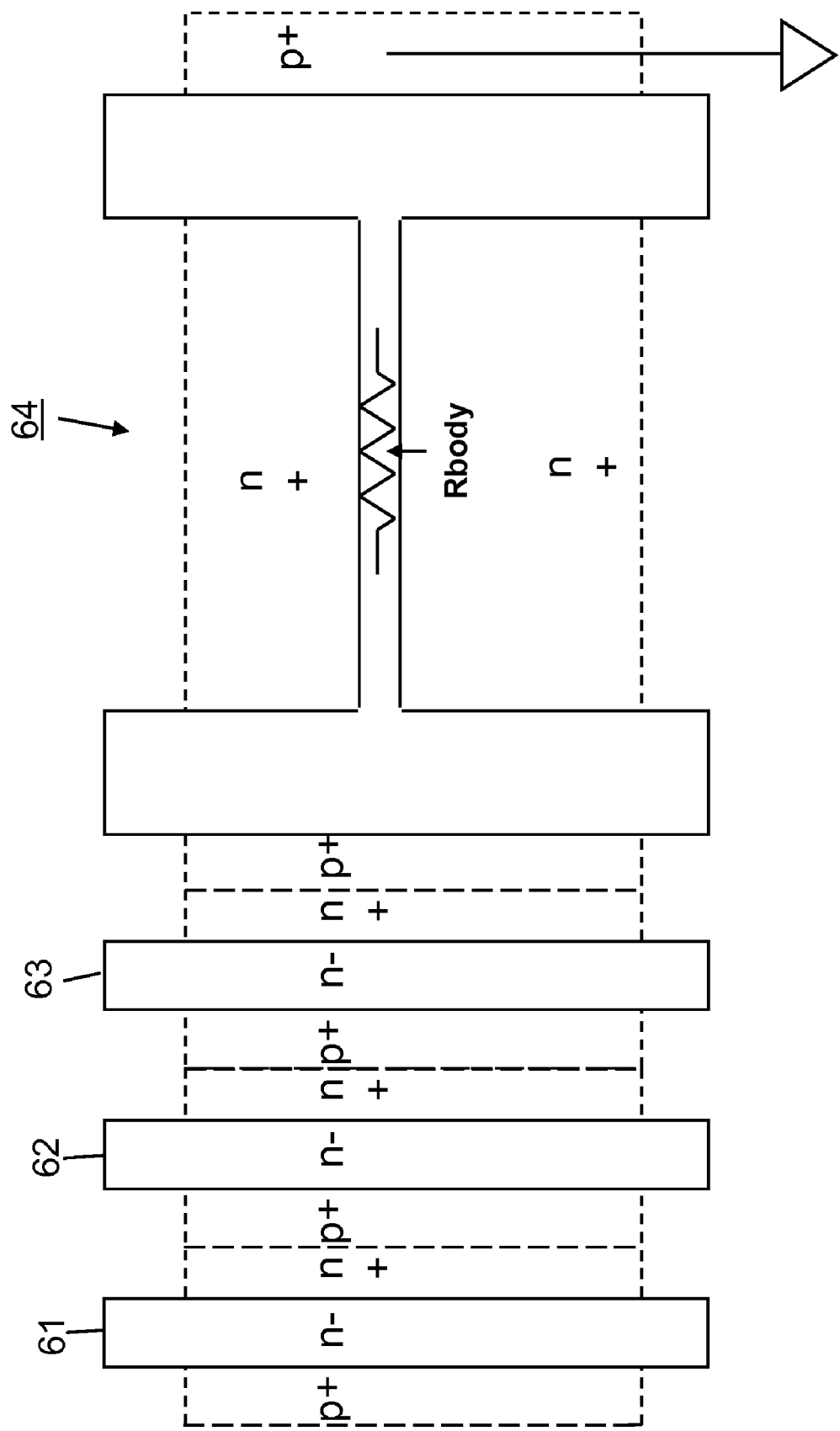
FIG. 6 illustrates a diode string based NFET structure in accordance with the invention.

A schematic illustration of the diode string based structure is shown in FIG. 6, in which three diodes 61, 62, and 63 are coupled to H-body NFET structure 64. As discussed above, the diode string 61-63 forms an injection device to inject current into the body/substrate of NFET structure 64 in order to lower the trigger voltage for the NFET protecting the protected circuit from ESD. Thus, NFET structure 64 forms a current pumping path. The n-portions of diodes 61-63 are a deposited polysilicon layer having a length of about 65 nm, i.e., about the same as the length of the crosspiece of the H-body. The present example is based upon 65 nm SOI technology. However, it is contemplated that the features of the instant invention would be applicable in other technologies, e.g., 45 nm technology, whereby the disclosed dimensional examples should be scaled to the new technology. Moreover, it is noted that it is contemplated that instead of an H-body structure, which includes input and output pads, a T-body structure having only a single pad, could have its body coupled to a separate H-body structure or intrinsic body resistor forming the very large resistor.

Figure 7:
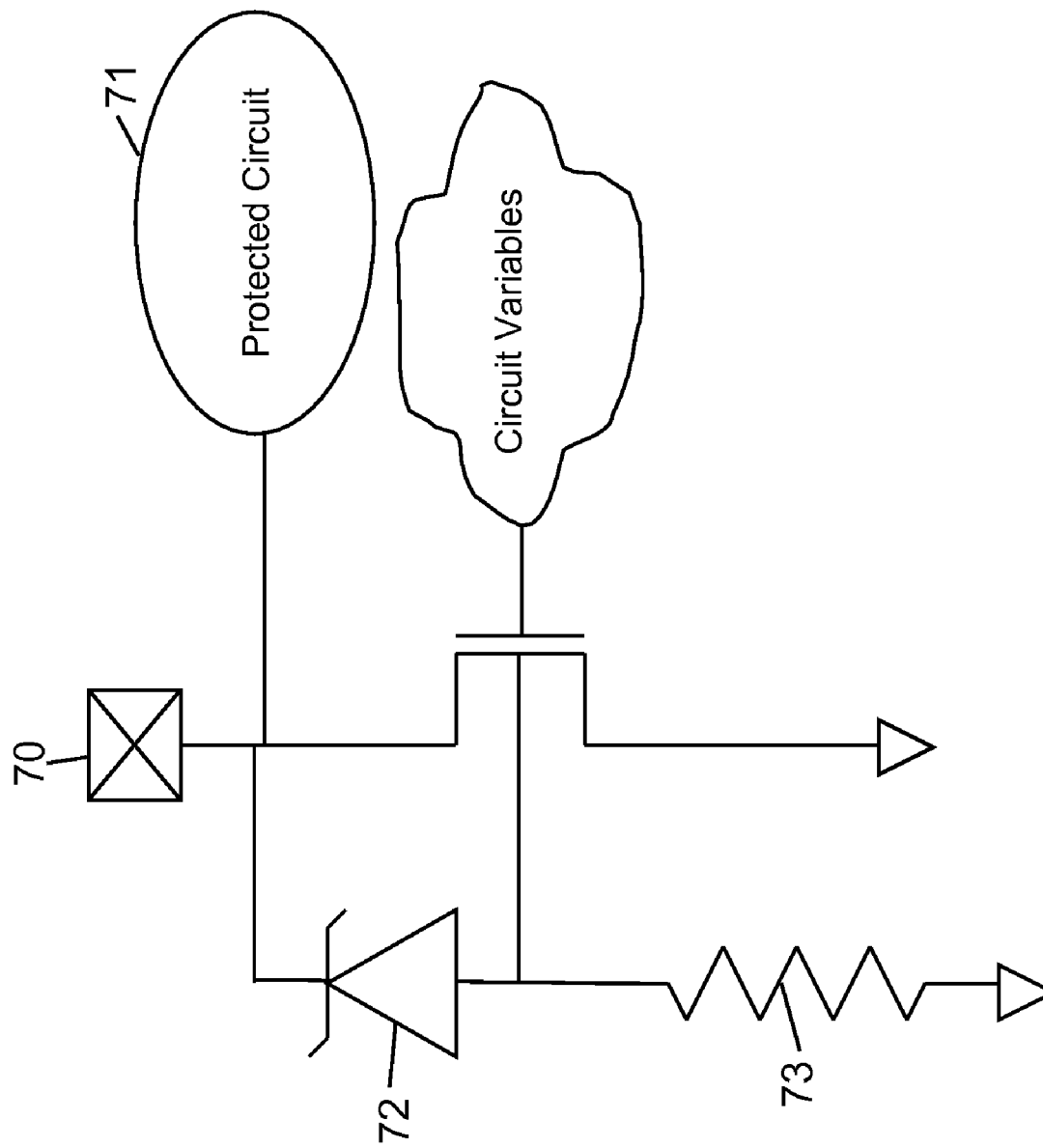
FIG. 7 illustrates the ESD protection circuit with a reverse biased zener diode current injector.

In an alternative exemplary embodiment of the invention, as illustrated in FIG. 7, the injection source can be formed by a reverse biased zener diode. While this embodiment is more compact than the embodiment shown in FIG. 5, it is necessary to carefully control the zener diode breakdown, which is not as easily controlled as the diode string of FIG. 5. This control is challenging because the worst anticipated pad voltage would be about 2.5V, whereas the breakdown of the zener diode is about 3.2V. By way of example, if I/O 70 provides a supply voltage to protected circuit 71, reversed biased zener diode 72 would provide for a 3.5V drop at breakdown coupled to ground through resistor 73 in the megaohm range. In this manner, the triggering voltage for the protection NFET 75 is lowered to a level to below the triggering voltage of the protected NFET in protected circuit 71. However, one must ensure that the triggering voltage is not too low so as to trigger during non-ESD events, thereby preventing the desired operation of the protected circuit under normal operating parameters.

While the invention has been described in terms of a preferred embodiment, those skilled in the art will recognize that the invention can be practiced with modifications within the spirit and scope of the appended claims.

What is claimed:

1. An electrostatic discharge (ESD) protection device for protecting a conventional FET, comprising:
   at least one FET body loaded with doping material to form a resistance in a megaohm range; and
   a triggering circuit coupled to a protection FET and the resistance,
   wherein the resistance raises a voltage of the at least one body, such that the protection FET is triggered at a voltage lower than the conventional FET.

2. The ESD protection device in accordance with claim 1, further comprising a current injector structured and arranged to supply current to the at least one FET body.

3. The ESD protection device in accordance with claim 2, wherein the current injector comprises a diode string.

4. A process for protecting a conventional FET from electrostatic discharge (ESD), the process comprising:
   raising a voltage of a body of a protection FET such that a trigger voltage of the protection FET is lower than that of the conventional FET,
   wherein the body is loaded with doping material to form a resistance in a megaohm range.

5. The process in accordance with claim 4, wherein the raising of the voltage of the body of the protection FET comprises injecting current into the body of the protection FET.

6. The process in accordance with claim 4, wherein the current is injected into the body of the protection FET via a diode string.

7. The process in accordance with claim 4, wherein the current is injected into the body of the protection FET via a reverse biased zener diode.

8. An electrostatic discharge (ESD) protection structure, comprising:
- an intrinsic body resistance loaded with a doping material to form a resistance in a megaohm region and a current pumping path; and
- an injection current input, wherein an ESD trigger voltage is lowered by current injected into the injection current input.

9. The ESD structure in accordance with claim 8 in combination with a current injector coupled to the injection current input.

10. The combination ESD structure and current injector in accordance with claim 9, wherein the current injector is composed of a diode string.

11. The combination ESD structure and current injector in accordance with claim 9, wherein the injector device is composed of a reverse biased zener diode.

* * * * *